United States Patent [19]

Asayama et al.

[11] Patent Number: 4,962,052

[45] Date of Patent: Oct. 9, 1990

[54] METHOD FOR PRODUCING SEMICONDUCTOR INTEGRATED CIRCUIT DEVICE

[75] Inventors: Kyoichiro Asayama, Tachikawa; Hiroyuki Miyazawa, Kodaira; Yutaka Kobayashi, Katsuta; Seigou Yukutake, Hitachi, all of Japan

[73] Assignee: Hitachi, Ltd., Tokyo, Japan

[21] Appl. No.: 478,050

[22] Filed: Feb. 7, 1990

Related U.S. Application Data

[63] Continuation of Ser. No. 338,238, Apr. 14, 1989, abandoned.

[30] Foreign Application Priority Data

Apr. 15, 1988 [JP]  Japan .................................. 63-91569

[51] Int. Cl.$^5$ ........................................... H01L 21/265
[52] U.S. Cl. ..................... 437/31; 437/34; 437/59; 437/48; 437/52; 357/34; 357/43; 357/42
[58] Field of Search ................... 437/31, 32, 33, 34, 437/59, 48, 51, 52, 56, 57, 81; 357/42, 43, 34, 59 H; 148/DIG. 9, DIG. 10, DIG. 11

[56] References Cited

U.S. PATENT DOCUMENTS

| | | | |
|---|---|---|---|
| 3,576,475 | 4/1971 | Kronlage | 357/43 |
| 4,047,217 | 9/1977 | McCaffrey | 357/43 |
| 4,475,279 | 10/1984 | Gahle | 437/99 |
| 4,717,686 | 1/1988 | Jacobs | 357/43 |

Primary Examiner—Olik Chaudhuri
Assistant Examiner—Kevin McAndrews
Attorney, Agent, or Firm—Antonelli, Terry, Stout & Kraus

[57] ABSTRACT

A method for producing a memory LSI having in its peripheral circuitry an MISFET of LDD structure and a vertical type bipolar transistor is disclosed. More particularly, an impurity for forming a low impurity concentration region of the said MISFET of LDD structure is introduced sideways of an emitter-base junction of the bipolar transistor. By the introduction of the said impurity, an effective impurity concentration near the base surface is reduced and the cut-off frequency of the bipolar transistor is improved.

17 Claims, 8 Drawing Sheets

METHOD FOR PRODUCING SEMICONDUCTOR INTEGRATED CIRCUIT DEVICE

This application is a continuation of application Ser. No. 338,238, filed on Apr. 14, 1989 now abandoned.

BACKGROUND OF THE INVENTION

The present invention relates to a method for producing a semiconductor integrated circuit device. Particularly, the present invention is effective in its application to a method for producing a combined type semiconductor integrated circuit device wherein both a bipolar transistor and a metal oxide semiconductor field effect transistor (hereinafter referred to as "MOSFET") are integrated on a single semiconductor substrate.

Recently, technical developments have been actively for a bipolar-complimentary MOSFET ("CMOS" hereinafter) having both the high drivability of the bipolar transistor and the low power consumption characteristic of CMOS.

On the other hand, a one transistor type memory cell comprising one capacitor for information charge storage and one MOSFET for switching is widely adopted as a memory cell of a dynamic random access memory ("DRAM" hereinafter) because it occupies a small area on a chip so is suitable for high integration. The DRAM is composed of a memory cell array for storing information and peripheral circuits. The peripheral circuits involve an X (row), Y (column) address input buffer circuit for selecting a desired one bit (one memory cell) from the memory cell array and writing or reading out information with respect to the thus-selected memory cell, a decoderdriver circuit and a sense circuit. The memory cell array occupies about 60% of the chip area of a memory LSI, having an influence on the power consumption and yield of the memory LSI. The peripheral circuits determine operating conditions for the memory such as memory access time and the level of input and output signals. For the peripheral circuits of the DRAM there usually is adopted the CMOS technique which attains low power consumption and high integration. But, for speed-up of the memory access time, etc. it is advantageous to apply the bipolar CMOS technique to the peripheral circuits. This is because a bipolar CMOS composite gate, as compared with a CMOS gate, is larger in load driving force and permits high-speed charge and discharge of a large output load at a portion where fan-out is large or such a large capacity load as a word line. The application of the bipolar CMOS technique to the peripheral circuits of DRAM is described, for example, in IEEE JOURNAL OF SOLID-STATE CIRCUITS, Vol. 23, No. 1, February 1988, pp. 5–11, and Japanese Patent Publication No. 65696/1986.

SUMMARY OF THE INVENTION

Having made studies about the increase of speed and of reliability of a memory LSI with the aforesaid bipolar CMOS technique applied to the peripheral circuits of DRAM, (hereinafter sometimes referred to as "Bi-CMOS/ DRAM"), the present inventors clarified the following facts.

The manufacturing process for forming both a bipolar transistor and a CMOS on a single silicon substrate inevitably becomes longer in comparison with the manufacturing process for forming a CMOS alone due to the difference in structure. For example, in a bipolar CMOS process based on the CMOS manufacturing process it is necessary to keep the increase in the number of steps for the formation of a bipolar transistor to a minimum. For the above reason the present inventors have studied forming an n type emitter region of an NPN-type bipolar transistor in the same manufacturing process for the source-drain region of an N-channel type MOSFET. However, since the source-drain region of the MOSFET is formed relatively deep in the vertical direction from the surface of the semiconductor substrate, the emitter region is also formed deep inevitably. Consequently, at the PN junction face of the emitter and base regions of the bipolar transistor, the side portion of the emitter region (or the surface portion of the base region) becomes wider in its area at the PN junction face. As a result, the PN junction capacitance increases and a cut-off frequency, $f_T$, of the bipolar transistor deteriorates.

The emitter and base regions of the bipolar transistor are formed by the ion implantation of impurity such as, for example, arsenic or boron into the semiconductor substrate from the substrate surface (top). Therefore, where the emitter and base regions are to be formed shallow in accordance with the proportional reduction law with increase in the degree of integration of the device, the impurity concentration in the emitter and base regions exhibits the highest peak value near the surface of the semiconductor substrate. Consequently, the side portion of the emitter region (or the surface portion of the base region) increases in the impurity concentration at the PN junction face and the PN junction capacitance of the side portion tends to further increase, thus preventing the improvement of the cutoff frequency $f_T$ which is in accordance with the proportional reduction law. Besides, since the impurity concentration at the side portion increases, the emitterbase junction voltage resistance becomes lower.

On the other hand, in the memory LSI it is necessary to effect high-speed charge and discharge of a large output load at a portion where fan-out is large or such a large capacitance load as a word line, in order to reduce the memory access time, and hence it is necessary to heighten the cut-off frequency $f_T$ of the bipolar transistor.

However, the provision of an additional manufacturing step for upgrading only the bipolar transistor, for example, for the aforementioned enhancement of the cut-off frequency $f_T$ and for higher voltage resistance, is not desirable because it would lead to the decrease in yield of the memory LSI and increase of the production cost.

The present invention has been accomplished on the basis of the above studies and it is the object thereof to provide a manufacturing process capable of enhancing the cut-off frequency $f_T$ of a bipolar transistor and improving the emitter-base junction voltage resistance without increase in the number of bipolar transistor manufacturing steps in a memory LSI which utilizes the bipolar CMOS technique.

The following is a main manufacturing process of the present invention.

A method for producing a semiconductor device having on a single semiconductor substrate at least one MOSFET and at least one bipolar transistor, which method comprises:

(a) forming a first semiconductor region of a second conductivity type on a first main surface of a semiconductor body of a first conductivity type, said first main surface being a region in which a first conductivity type MOSFET is to be formed;

(b) forming a gate electrode of said first conductivity type MOSFET on said first semiconductor region through a gate insulating film;

(c) introducing a first conductivity type impurity into the surface of the first semiconductor region except the portion under said gate electrode and also into a second main surface of the semiconductor body, said second main surface being a region in which a vertical bipolar transistor is to be formed, whereby there are formed a pair of second semiconductor regions serving as part of source and drain regions of said MOSFET and a third semiconductor region serving as part of a base region of the bipolar transistor;

(d) introducing a second conductivity type impurity into part of the second main surface to form a fourth semiconductor region, said fourth semiconductor region serving as the base region of the bipolar transistor and having an impurity concentration higher than that of the third semiconductor region; and (e) introducing a first conductivity type impurity of high concentration into the first semiconductor region except the portion under said gate electrode and a side wall formed on the side face of the gate electrode and also into part of the fourth semiconductor region, whereby there are formed a pair of fifth semiconductor regions having an impurity concentration higher than that of the second semiconductor region and serving as part of the source and drain regions of the MOSFET and also formed a sixth semiconductor region serving as an emitter region of the bipolar transistor.

The above manufacturing process will be explained below briefly.

In forming a base region of a bipolar transistor, an impurity for forming a source-drain region of a low concentration in an MOSFET having a lightly doped drain structure of a conductivity type reverse to that of the base region is ion-implanted into the surface of a semiconductor substrate in which the base region is to be formed.

According to the above process, the impurity concentration can be decreased effectively only near the surface of the base region by the impurity of a conductivity type reverse to that of the base region which impurity is ion-implanted in the semiconductor substrate surface in which the base region is to be formed. Therefore, even when an emitter region of a bipolar transistor has been formed by the same manufacturing process as that for a high concentration source-drain region of MOSFET, it is possible to prevent the increase in PN junction capacitance of the side portion (or the surface portion of the base region), and the PN junction voltage resistance can be improved.

Further, the third semiconductor region of low concentration formed by the impurity introduced near the surface of the base region can be formed by the same manufacturing process as that for the second semiconductor regions of low concentration in MOSFET of LDD structure. Thus, there is no increase in the number of steps for forming a bipolar transistor.

DESCRIPTION OF THE PREFERRED EMBODIMENT

The construction of the present invention will be described hereinunder in terms of an embodiment of the invention applied to a DRAM having in its peripheral circuits a complementary MISFET and a bipolar transistor.

In all of the drawings for illustration of the embodiment, the components having the same functions are indicated by the same reference numerals to omit the repetition of explanation.

Figure 1:
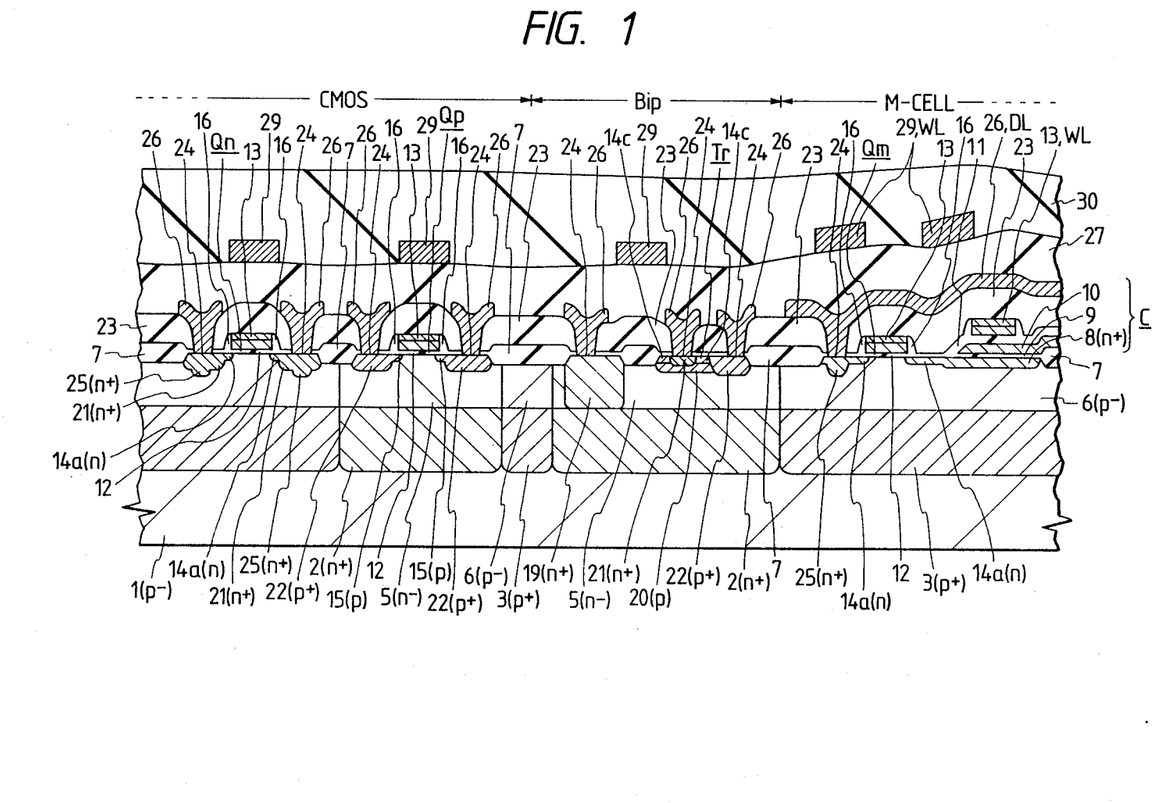
FIG. 1 is a sectional view of a principal portion of a combined type semiconductor integrated circuit device embodying the present invention in which a bipolar transistor, a CMOSFET and memory cells are formed on a single semiconductor substrate.
Figure 2:
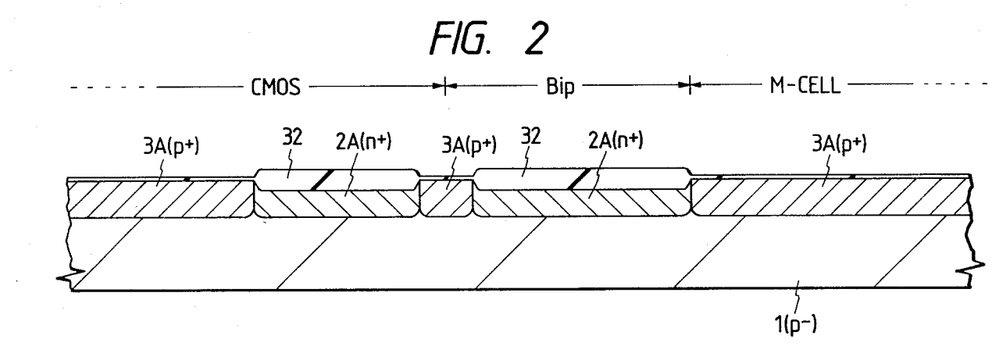
FIGS. 2 to 14 are sectional views of a principal portion respectively showing steps of a process for producing the combined type semiconductor integrated circuit device shown in FIG. 1.

A combined type semiconductor integrated circuit device (Bi-CMOS/DRAM) according to an embodiment of the present invention is illustrated in FIG. 1 (a sectional view of a principal portion). As shown in FIG. 1, the combined type semiconductor integrated circuit device is constituted by a body comprising a p⁻type semiconductor substrate 1 formed by a single crystal silicon and an n⁻type epitaxial layer 4 grown on a main surface of the substrate. On the main surface of the circuit device there are formed a bipolar transistor forming region Bip, a complementary MISFET forming region CMOS and a memory cell forming region M-CELL to constitute peripheral circuits of a DRAM.

In the complementary MISFET forming region CMOS there is disposed a complementary MISFET, which is composed of an n channel MISFET Qn and a p channel MISFET Qp.

The n channel MISFET Qn is constituted in a main surface of a p⁻type well region 6 in the portion surrounded with a field insulating film 7. The field insulating film 7 is a silicon oxide film formed by oxidizing the main surface of the well region 6. Below the field insulating film 7, the main surface portion of the well region 6 is provided with a p channel stopper region though not shown. The well region 6 is provided in a main surface portion of the epitaxial layer 4. The bottom of the well region 6 is in contact with a buried p⁺type semiconductor region 3 formed between the semiconductor substrate 1 and the epitaxial layer 4. The buried p⁺type semiconductor region 3 is constructed so as to lower the resistivity value of the bottom of the well region 6 and prevent a parasitic thyristor behavior peculiar to the complementary MISFET. The n channel MISFET Qn is principally composed of a well region 6, a gate insulating film 12, a gate electrode 13, a pair of n⁻type semiconductor regions 14a serving as source and drain regions, and a pair of n⁺type semiconductor regions 21 also serving as source and drain regions.

The well region 6 is used as a channel forming region. The gate insulating film 12 is a silicon oxide film formed by oxidizing the main surface of the well region 6. The gate electrode 13 is constituted by a composite film formed by laminating a high melting metal silicide film onto a polycrystalline silicon film. The gate electrode 13 is not limited to the said composite film; it may be constituted by a single layer of a polycrystalline silicon film or a high melting metal film, or a composite film thereof. The gate electrode 13 is formed by a second-layer gate wiring step in the manufacturing process.

The n⁻type semiconductor regions 14a, which are of a low impurity concentration, are each constituted integrally with the adjacent n⁺type semiconductor region 21 and located between the region 21 and the channel forming region. The n⁻type semiconductor regions 14a constitute an n channel MISFET Qn of a so-called LDD (Lightly Doped Drain) structure. They are formed sideways of the gate electrode 13 self-alignmentwise relative to the side portion of the same electrode. The n⁺type semiconductor regions 21, which are of a high impurity concentration, are formed sideways of side wall spacers 16 formed on the side walls of the gate electrode 13, self-alignmentwise relative to the side portions of side wall spacers.

The n⁻type semiconductor regions 14a are each formed, for example by ion-implanting an n type impurity such as phosphorus or arsenic into the main surface portion of the well region 6 followed by annealing. The n type impurity for forming the n⁻type semiconductor region is also introduced simultaneously into a main surface portion of a later-described bipolar transistor forming region Bip t effectively lower the impurity concentration near the surface of the base region of the bipolar transistor.

To the n⁺type semiconductor regions 21 which are the source and drain regions of the n channel MISFET Qn are connected lines 26 through connection holes 24 formed in layer insulation films 17 and 23. Each n⁺type semiconductor region 21 and each line 26 are connected through an n⁺type semiconductor region 25. The n⁺type semiconductor region 25 is formed by introducing an n type impurity (P or As) into the region defined by the connection hole 24. It is constructed so as to prevent shortcircuiting between the well region 6 and the line 26 in the event of mask alignment error of the position of the connection hole 24. The line 26 is constituted, for example, by an aluminum film. As the line 26 there also may be used an aluminum alloy film incorporating copper and/or silicon therein. The line 26 is formed by a firstlayer wiring step in the manufacturing process.

In the complementary MISFET, the p channel MISFET Qp is formed in a main surface of an n⁻type well region 5 in the portion surrounded with the field insulating film 7. The well region 5 is formed in the main surface portion of the epitaxial layer 4. The bottom of the well region 5 is in contact with a buried, n⁺type semiconductor region 2 which is provided between the semiconductor substrate 1 and the epitaxial layer 4. Like the buried, p⁺type semiconductor region 3, the buried, n⁺type semiconductor region 2 is constructed so as to decrease the resistivity value of the bottom of the well region 5 and prevent the parasitic thyristor behavior peculiar to the complementary MISFET. The p channel MISFET Qp is principally composed of a well region (channel forming region) 5, a gate insulating film 12, a gate electrode 13, a pair of p type semiconductor regions 15 serving as source and drain regions, and a pair of p⁺type semiconductor regions 22 also serving as source and drain regions. It is of an LDD structure like the n channel MISFET Qp.

To the p⁺type semiconductor regions 22 serving as source and drain regions of the p channel MISFET Qp are connected lines 26 through connection holes 24 formed in the layer insulation films 17 and 23.

In the bipolar transistor forming region Bip is disposed a bipolar transistor Tr. The bipolar transistor Tr is provided in main surface of the semiconductor substrate 1 in the portion surrounded with an isolation region. The isolation region is composed of the semiconductor substrate 1, a buried p⁺type semiconductor region 3, a p⁻type well region 6 and a field insulating film 7. The buried p⁺type semiconductor region 3 and the well region 6 as constituents of the isolation region are formed by the same layer (same manufacturing step) as the buried p⁺type semiconductor region 3 and well region 6 formed in the complementary MISFET forming region CMOS. The bipolar transistor Tr is an npn type comprising an n type collector, a p type base region and an n type emitter region.

The n type collector region is composed of a buried n⁺type semiconductor region 2 which is used as a buried collector region, a potential raising n⁺type semiconductor region 19 for raising the collector potential of the buried collector region, and an n⁻type well region 5 (or an epitaxial layer 4). The buried n⁺type semiconductor region 2 is formed by the same layer (same manufacturing step) as the buried n⁺type semiconductor region 2 of the complementary MISFET forming region CMOS. That is, the buried n⁺type semiconductor region 2 is provided between the semiconductor substrate 1 and the epitaxial layer 4. Likewise, the well region 5 is formed by the same layer (same manufacturing step) as the well region 5 of the complementary MISFET forming region CMOS. The potential raising n⁺type semiconductor region 19 is provided in a main surface portion of the well region 5 and its bottom is in contact with the buried n⁺type semiconductor region 2.

To the potential raising n⁺type semiconductor region 19 in the n type collector region is connected a wire 26 through a connection hole formed in layer insulation films 17 and 23.

The p type base region is principally composed of a p type semiconductor region 20 as an intrinsic base region and a p⁺type semiconductor region 22 as a graft base region. The p and p³⁰ type semiconductor regions 20, 22 are integrally constituted in the main surface portion of the well region 5.

Further, at the surface portion of the p type base region is formed a p⁻type semiconductor region 14C of a lower impurity concentration than that of the p type semiconductor region 20 which serves as an intrinsic base region. The p⁻type semiconductor region 14C is formed by introducing an n type impurity (e.g. phosphorus or arsenic) in the surface portion of the p type base region. By this introduction of the n type impurity the impurity concentration at the surface portion of the p type base region is reduced effectively. By forming the p⁻type semiconductor region 14C it is possible to reduce the PN junction capacitance near the surface portion of a laterdescribed n type emitter region 21 and the p type base region, and the PN junction voltage resistance can be enhanced. Consequently, the out-off frequency $f_T$ of the bipolar transistor Tr can be improved without decrease of the emitter-base junction voltage resistance. The n type impurity for forming the p⁻type semiconductor region 14C is introduced together with the impurity for forming the n⁻type semiconductor regions 14a which serve as part of the source-drain region of the n channel type MISFET.

The p⁺type semiconductor region 22 as a graft base region is formed by the same layer (same manufacturing step) as the p⁺type semiconductor regions 22 serving as source and drain regions of the p channel MISFET Qp.

To the p⁺type semiconductor region 22 in the p type base region is connected a line 26.

The n type emitter region is constituted by an n⁺type semiconductor region 21, which is provided in a main surface portion of the p type semiconductor region 20 which is an intrinsic base region in the p type base region. The n+type semiconductor region 21 is formed by the same layer (same manufacturing step) as the n+type semiconductor regions 21 serving as source and drain regions of the n channel MISFET Qn.

To the n+type semiconductor region 21 which is the n type emitter region, there is connected a line 26.

In the memory cell forming region M-CELL there are disposed a plurality of DRAM memory cells in a matrix form. The memory cells are constituted by a series circuit of a memory selecting MISFET Qm and an information storing capacitor C, which are both provided in a main surface portion of the p⁻type well region 6 in the portion surrounded with the field insulating film 7.

The information storing capacitor C is of a so called planar structure which is a laminate of an n+type semiconductor region 8 serving as a lower electrode, a dielectric film 9 and a plate electrode 10 as an upper electrode. The n+type semiconductor region 8 is provided in the main surface portion of the well region 6. The dielectric film 9 is a silicon oxide film formed, for example, by oxidizing a main surface of the n+type conductor region 8. It may be a single layer of a silicon nitride film, or a composite film of a silicon oxide film and a silicon nitride film put one upon another. The plate electrode 10 is formed by a polycrystalline silicon film for example. To the plate electrode 10 is applied a supply voltage of ½ Vcc though this constitutes no limitation. The supply voltage ½ Vcc is an intermediate voltage, about 2.5 V, between a supply voltage Vcc, e.g. a circuit operating voltage of 5 V, and a reference voltage Vss, e.g. a circuit ground potential of 0V. The plate electrode 10 is formed by the first-layer wiring step in the manufacturing process. In the information storing capacitor C there may be provided a p+type semiconductor region of a higher impurity concentration than that of the well region 6 along the outer periphery of the n+type semiconductor region 8 as a lower electrode to increase the pn junction capacitance of the n+type semiconductor region 8. This increase of the pn junction capacitance leads to an increase in the amount of charge stored (amount of charge as information) of the information storing capacitor C, whereby it is possible to reduce the occurrence of an α ray soft error.

The p+type semiconductor region 3 forms a potential barrier for preventing the electron of an electron-hole pair generated upon incidence of α ray on a memory cell, from entering the n+type semiconductor region 8 which serves as a lower electrode of the information storing capacitor C, whereby it is possible to reduce the occurrence of an α ray soft error. In this embodiment, the p+type semiconductor region 3 present throughout the whole surface below the memory cells constitutes a potential barrier against the electron to reduce the occurrence of an α ray soft error.

The memory cell selecting MISFET Qm is composed principally of a well region 6 (a channel forming region), a gate insulating film 12, a gate electrode 13, and a pair of n type semiconductor regions 14 serving as source and drain regions. The gate electrode 13 of the memory cell selecting MISFET Qm is constituted integrally with a word line (WL) which extends in the gate width direction. The word line 13 is constituted so as to extend over a field insulating film 7 and a plate electrode 10 with a layer insulation film 11 interposed between the electrode and the word line. The n type semiconductor regions 14 serving as source and drain regions are constructed at a lower impurity concentration and a shallower junction in comparison with the substantial source and drain (n+type semiconductor regions 21) of the n channel MISFET Qn of the complementary MISFET. That is, in the memory cell selecting MISFET Qm, the amount of n type impurity in the n type semiconductor region 14 to be diffused toward the channel forming region, namely, the distance of lateral diffusion, can be made smaller as compared with that the n+type semiconductor regions 21. In the memory cell selecting MISFET Qm thus constructed, it is possible to ensure a sufficient channel length and reduce the occurrence of a short channel effect, whereby the memory cell area can be reduced to attain higher integration of DRAM. The resistivity value of the channel forming region in the memory cell selecting MISFET Qm is originally high, so even when the source and drain regions are constituted by the n type semiconductor regions 14 of a low impurity concentration and exhibit a somewhat higher resistivity value, there is little change in the information writing and reading speeds of each memory cell.

One n type semiconductor region 14 of the memory cell selecting MISFET Qm is connected to the n+type semiconductor region 8 which serves as a lower electrode of the information storing capacitor C, while to the other n type semiconductor region 14 is connected a data line (DL) 26 through a connection hole 24 formed in layer insulation films 17 and 23. The other n type semiconductor region 14 and the data line 26 are interconnected through an n+type semiconductor region.

In the memory cell forming region M-CELL, a shunting word line (WL) 29 extends over the data line 26 in the direction intersecting the data line 26 with a layer insulation film 27 interposed between both lines. Though not shown, the shunting word line 29 is connected to the word line 13 in a predetermined region through an intermediate conductive film 26 which has been formed in the first-layer wiring step. It is formed so as to reduce the resistance value of the word line 13, in the form of, for example, an aluminum film or an aluminum alloy film, by the second wiring step in the manufacturing process.

A passivation film 30 as a protective film is formed throughout the entire surface of the substrate, including the portions over the shunting word lines 29 and lines 26.

Using the bipolar transistor Tr, MISFET Qn, Qp, Qm and capacitor C of the constructions described above, there can be constituted such a two-input NAND circuit as disclosed in FIG. 1 of IEEE JOURNAL OF SOLID-STATE CIRCUITS, Vol. 23, No. 1, February 1988, such a decoder driver circuit as disclosed in FIG. 11 thereof, or memory cells.

The method for producing the thus-constructed combined type semiconductor integrated circuit device will be explained below briefly with reference to FIGS. 3 to 13 (sectional views of a principal portion of the device shown manufacturing step by step).

First, the p⁻type semiconductor substrate 1 is formed using a single crystal silicon at a low impurity concentration with a resistance value of, say, 10 to 15 ohm·cm.

Next, in each of the p channel MISFET Qp forming region in the complementary MISFET Q forming region CMOS and the bipolar transistor forming region Bip, an n type impurity is introduced selectively in the main surface portion of the semiconductor substrate 1. As the n type impurity there is used antimony of a high impurity concentration of, say, $10^{14}$ to $10^{15}$ atoms/cm$^2$, which is introduced by an ion implantation method with an energy of 90 to 110 KeV.

Then, steam oxidation is performed at a temperature of about 1,000° C. and stretch-diffusion is applied to the n type impurity to form an n$^+$type semiconductor region 2A. By the same manufacturing step as that of forming the n$^+$type semiconductor region 2A there is formed a silicon oxide film 32 having large thickness of 2,000 to 4,000Å on the n$^+$type semiconductor region 2A.

Next, in the n channel MISFET Qn forming region of the complementary MISFET forming region CMOS, the memory cell forming region M-CELL and the isolation region, a p type impurity is introduced selectively in the main surface portion of the semiconductor substrate 1. This introduction of the p type impurity is performed using the silicon oxide film 32 as an impurity introducing mask. That is, the p type impurity is introduced self-alignmentwise with respect to the n$^+$type semiconductor region 2A, using boron of, say, $10^{13}$ to $10^{14}$ atoms/cm$^2$, by an ion implantation method with an energy of 40 to 60 KeV.

Then, a heat treatment of about 1,000° C. is performed and stretch-diffusion is applied to the p type impurity to form a p$^+$type semiconductor 3A. By this heat treatment it is possible to remedy the damage of the main surface portion of the semiconductor substrate 1 caused by the foregoing introduction of the n type impurity and that of the p type impurity.

Next, the silicon oxide film 32 on the main surface of the semiconductor substrate 1 is removed.

Then, an n$^-$type epitaxial layer 4 is allow to grow on the main surface of the semiconductor substrate 1, at an impurity concentration with a resistance value of, say, 2 to 4 ohm·cm and at a thickness of 1.5 to 1.8 μm. With formation of the epitaxial layer 4, the impurities in the n$^+$and p$^+$type semiconductor regions 2A, 3A formed in the main surface portion of the semiconductor substrate 1 are diffused (rise) in the epitaxial layer 4 to form buried n$^+$and p$^+$type semiconductor regions 2, 3.

Next, in each of the p channel MISFET Qp forming region of the complementary MISFET forming region CMOS and the bipolar transistor forming region Bip, an n type impurity is introduced selectively in the main surface portion of the epitaxial layer 4. The n type impurity is introduced, using phosphorus of a low impurity concentration of, say, $10^{12}$ atoms/cm$^2$, by an ion implantation method with an energy of 120 to 130 KeV.

Then, steam oxidation is performed at a temperature of 900 to 1,000° C. and stretch-diffusion is applied to the n type impurity to form an n$^-$type well region 5. By the same manufacturing step as that of forming the n$^+$type well region 5 there is formed a silicon oxide film having a thickness of 1,000 to 1,500Å on the n$^-$type well region 5.

Next, in the n channel MISFET Qn of the complementary MISFET forming region CMOS, the memory cell forming region M-CELL and the isolation region, a p type impurity is introduced in the main surface portion of the epitaxial layer 4. This introduction of the p type impurity is performed using the silicon oxide film on the n$^-$type well region 5 as an impurity introducing mask. That is, the p type impurity is introduced self-alignmentwise with respect to the n$^-$type well region 5, using BF$_2$ of, say, $10^{12}$ atoms/cm$^2$, by an ion implantation method.

Then, a heat treatment is performed at a temperature of 1,000 to 1,200° C. and stretch-diffusion is applied to the p type impurity to form a p$^-$type well region 6.

Figure 3:
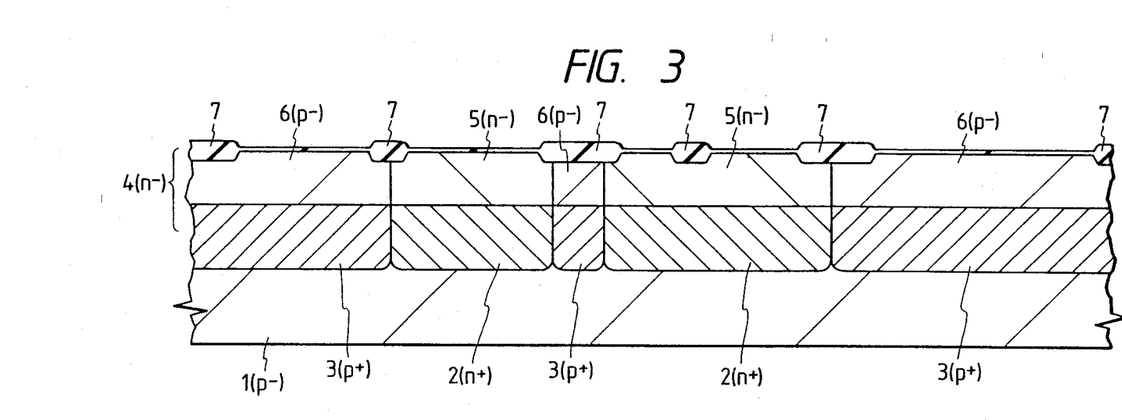

Next, a field insulating film 7 is formed selectively on each of the main surface of the n$^-$type well region 5 and that of the p$^-$type well region 6, as shown in FIG. 3. The field insulating film 7 is a silicon oxide film having a thickness of, say, 5,000 to 6,000Å obtained by steam oxidation at a temperature of about 1,000° C. using a non-oxidizable mask such as a silicon nitride film. Though not shown, a p type channel stopper region is formed below the field insulating film 7 in the p$^-$type well region 6. For example, the p type channel stopper region can be formed by introducing a p type impurity selectively before formation of the field insulating film 7 and by stretch-diffusion thereof through the heat treatment for formation of the field insulating film 7.

Then, in the memory cell forming region M-CELL, an n type impurity is introduced selectively in the main surface portion of the p$^-$type well region 6 to form an n$^+$type semiconductor region 8. The n$^+$type semiconductor region 8, which constitutes a lower electrode of the information storing capacitor C, is formed, for example, by introducing arsenic of a high impurity concentration of $10^{14}$ atoms/cm$^2$ according to an ion implantation method with an energy of 110 to 130 KeV.

Next, in the memory cell forming region M-CELL, a dielectric film 9 is formed on the main surface of at least the n$^+$type semiconductor region 8. The dielectric film 9 is, for example, a silicon oxide film having a thickness of 80 to 100Å, formed by steam oxidation.

Figure 4:
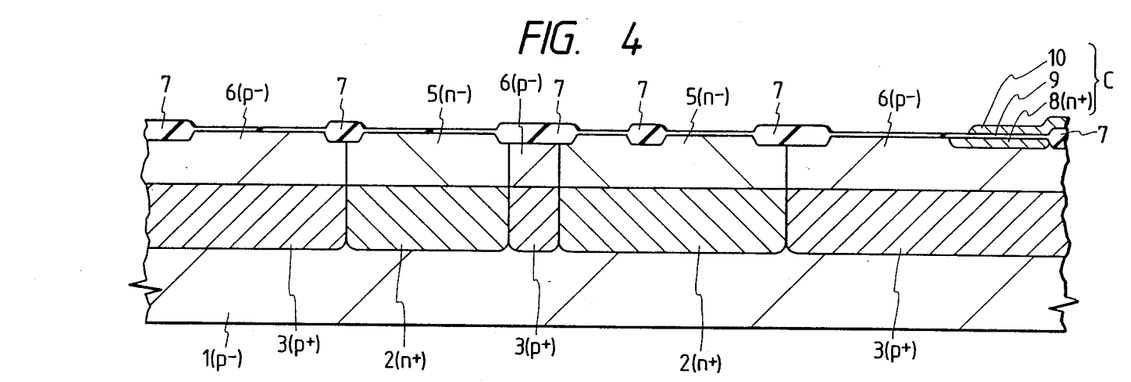

Then, in the memory cell forming region M-CELL, as shown in FIG. 4, a plate electrode 10 is formed on the dielectric film 9 and also on the field insulating film 7, that is, throughout the while surface of the memory cell array except the memory cell selecting MISFET Qm forming region. The plate electrode 10, which is used as an upper electrode of the information storing capacitor C, is a polycrystalline silicon film with a thickness of 3,000 to 4,000Å formed by deposition according to a CVD (chemical vapor deposition) method for example. In this polycrystalline silicon film is introduced an n type impurity, e.g. phosphorus or arsenic, to reduce the resistance value. The polycrystalline silicon film is formed by the first-layer gate wiring step in the manufacturing process so that an end portion of the plate electrode 10 is inclined to mitigate a stepped shape. By forming the plate electrode 10 there is completed the memory cell information storing capacitor C of DRAM.

Next, a layer insulation film 11 is formed on the surface of the plate electrode 10 of the information storing capacitor C. It is a silicon oxide film with a thickness of 2,500 to 3,500Å formed, for example, by oxidizing the surface of the polycrystalline silicon film.

Then, an impurity for adjusting a threshold voltage Vth is introduced throughout the whole surface of the substrate including the main surface portions of the n$^-$and p$^-$type well regions 5, 6 serving as the MISFET forming region. For example, this impurity is introduced using boron of about $10^{12}$ atoms/cm$^2$ by an ion implantation method with an energy of 30 to 40 KeV. It is not introduced in the n$^+$type semiconductor region 8 of the information storing capacitor C because the plate electrode 10 and the layer insulation film 11 serve as masks in the impurity introduction.

Next, a gate insulating film 12 is formed on the main surfaces of the n⁻and p⁻well regions 5, 6 serving as the MISFET forming region. For example, it is a silicon oxide film formed by steam oxidation, having a small thickness of about 200Å.

Figure 5:
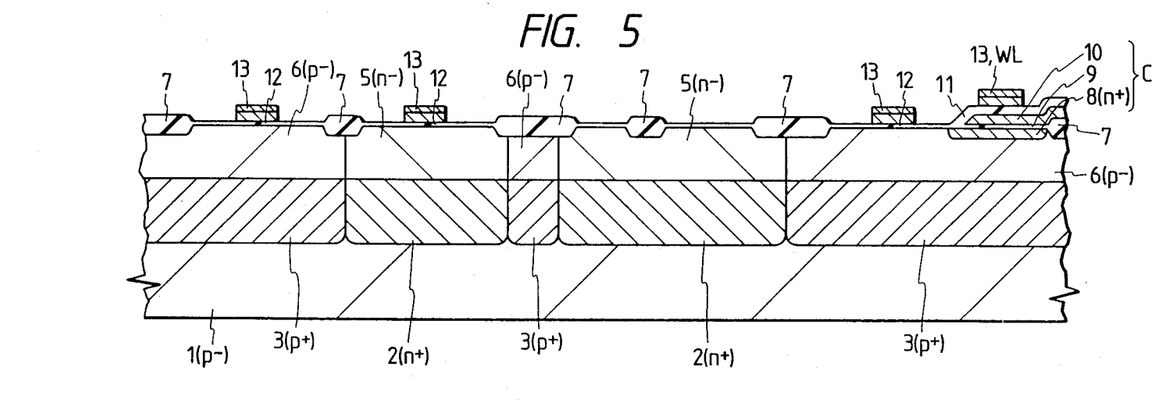

Then, as shown in FIG. 5, a gate electrode 13 is formed on the gate insulating film 12, for example as a composite film obtained by laminating a $WSi_2$ film onto a polycrystalline silicon film. The underlying polycrystalline silicon film is formed at a thickness of 1,500 to 2,500Å by a CVD method for example. In the polycrystalline silicon film is introduced an n type impurity, e.g. phosphorus or arsenic, to reduce the resistance value. The $WSi_2$ film is formed at a thickness of 2,500 to 3,500Å, for example by sputtering or a CVD method. A heat treatment is applied to the $WSi_2$ film for the purpose of densifying and etching damage removal. Together with the step of forming the gate electrode 13 there is formed a word line (WL) 13 extending over both the layer insulation film 11 and the field insulating film 7 in the DRAM forming region. The gate electrode and word line 13 are formed by the second-layer wiring step in the manufacturing process.

Figure 6:
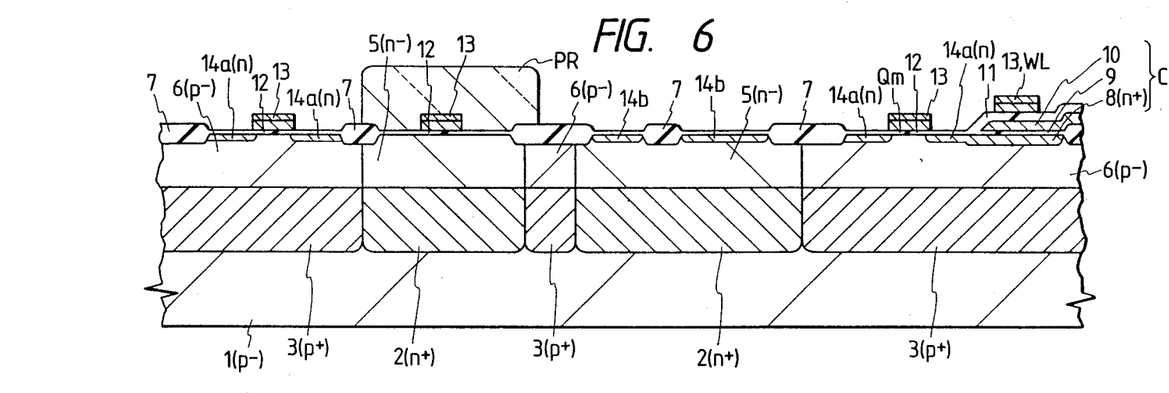

Next, as shown in FIG. 6, n type semiconductor regions 14a and 14b are formed in the main surface portion of the p type well region in each of the n channel MISFET Qn of the complementary MISFET forming region CMOS and the memory cell selecting MISFET Qm forming region of the memory cell forming region M-CELL, and also in the main surface portion of the n type well region in the bipolar transistor forming region Bip. The n type semiconductor regions 14a and 14b not only constitute source and drain regions of the memory cell selecting MISFET Qm but also constitute semiconductor layers for effectively reducing the impurity concentration of the base region of the bipolar transistor. For example, they can be formed at a depth of 0.1 μm from the substrate surface by the introduction of phosphorus of a low impurity concentration of, say, $10^{13}$ atoms/cm² according to an ion implantation method with an energy of 50 to 70 KeV. Since an n type impurity is introduced using the gate electrode 13 and the field insulating film 7 as masks in impurity introduction, the n type semiconductor regions 14a and 14b are formed self-alignmentwise with respect thereto. In the region (p channel type MISFET Qp forming region) in which the n type impurity is not introduced, a photoresist film PR is used as a mask in impurity introduction.

By forming the n type semiconductor regions 14a there are completed the memory cell selecting MISFET Qm and memory cells of DRAM.

Figure 7:
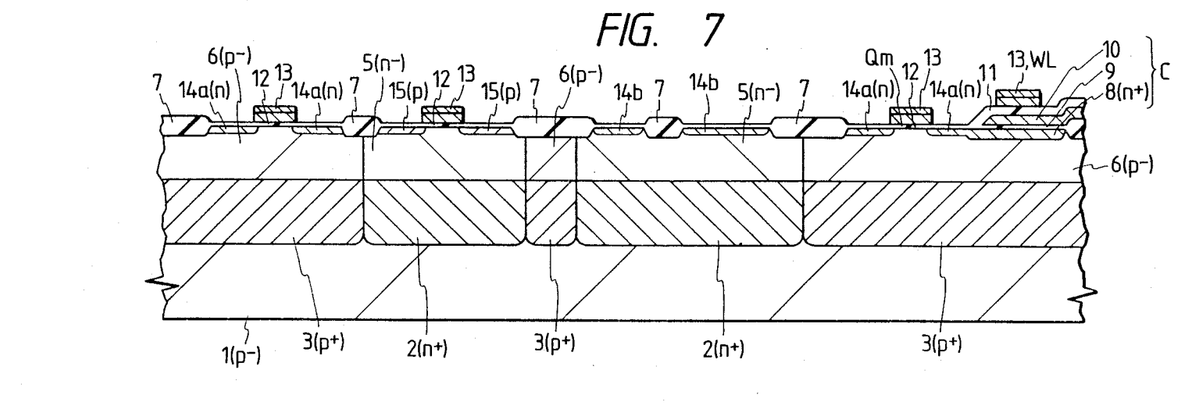

Then, in the p channel MISFET Qp forming region of the complementary MISFET forming region CMOS, p type semiconductor regions 15 are formed in the main surface portion of the n⁻type well region 5, after removal of the photoresist PR, as shown in FIG. 7. The p type semiconductor regions 15, which constitute a p channel MISFET Qp of an LDD structure, can be formed, for example, using $BF_2$ of a low impurity concentration of about $10^{13}$ atoms/cm², according to an ion implantation method with an energy of 40 to 60 KeV. Since a p type impurity is introduced using the gate electrode 13 and the field insulating film 7, the p type semiconductor regions 15 are formed self-alignmentwise with respect thereto. In the region in which the p type impurity is not introduced, there is formed a mask for use in impurity introduction, such as a photoresist film.

Next, a side wall spacer 16 is formed on each side wall of the gate electrode 13. For example, the side wall spacer 16 can be formed by applying an anisotropic etching such as RIE to a silicon oxide film with a thickness of 4,000 to 5,000Å obtained according to a CVD method. The thickness of the side wall spacer 16 in the gate length direction of the gate electrode 13 is determined by the thickness of the silicon oxide film deposited and the etching quantity. The side wall spacer 16 is formed self-alignmentwise with respect to the gate electrode 13. The insulating film 12 formed in the portion other than under the gate electrode is removed by the anisotropic etching which is applied to form the side wall spacers, so an insulating film 17 is subsequently formed by subjecting the whole surface of the substrate to a thermal oxidation.

Figure 8:
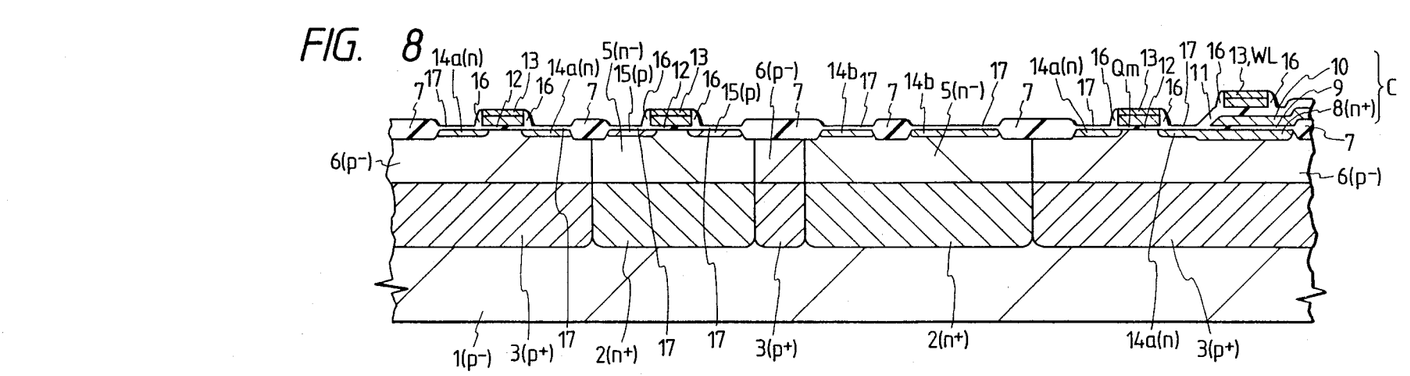

Next, a mask 33 for use in impurity introduction is formed throughout the entire surface of the substrate including the portions over the gate electrode and word line 13. The mask 33 functions against impurity to be introduced in the following step and it is a photoresist film for example.

Then, in the region for forming the potential raising n⁺type transistor region in the bipolar transistor forming region Bip, an opening 18 is formed in the mask 33 for use in impurity introduction.

Figure 9:
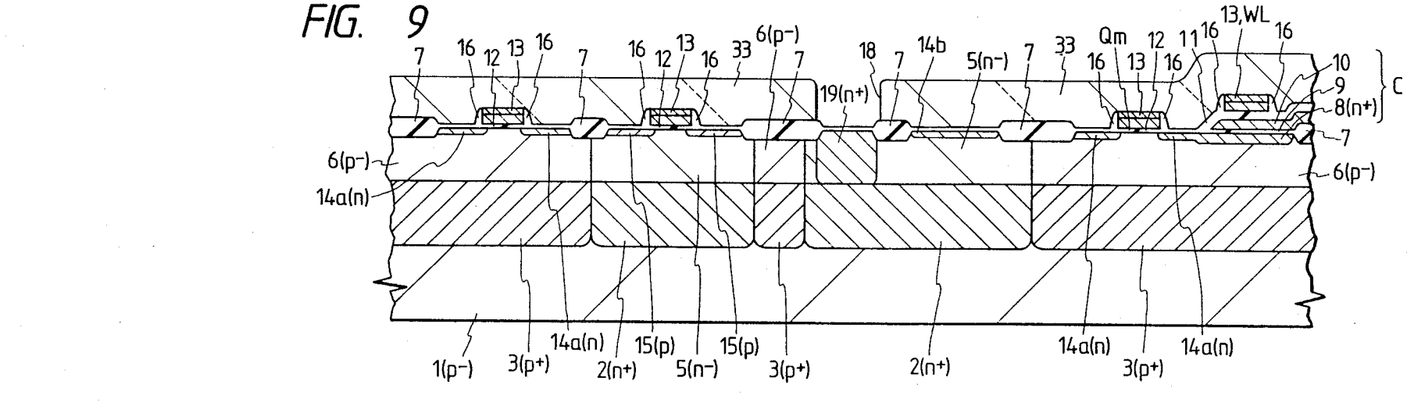

Next, using mainly the mask 33, an n type impurity is introduced in the main surface portion of the n⁻type well region 5 in the portion defined by the opening 18, as shown in FIG. 9, to form a potential raising n⁺type semiconductor region 19 of the bipolar transistor 19. For example, the potential raising n⁺type semiconductor region 19 can be formed by an ion implantation method with an energy of 70 to 90 KeV, using phosphorus (or arsenic or antimony) of a high impurity concentration of $10^{15}$ to $10^{16}$ atoms/cm². It can be formed by applying a heat treatment at a temperature of 900° to 1,000° C. to the n type impurity after introduction to stretch-diffuse the impurity to a depth of about 1 μm. The bottom of the potential raising $n^{30}$ type semiconductor region 19 is formed for contact with the buried n⁺type semiconductor region 2. The n type semiconductor region 14b is integral with the n⁺type semiconductor region 19.

Thereafter, the mask 33 for use in impurity introduction is removed.

Figure 10:
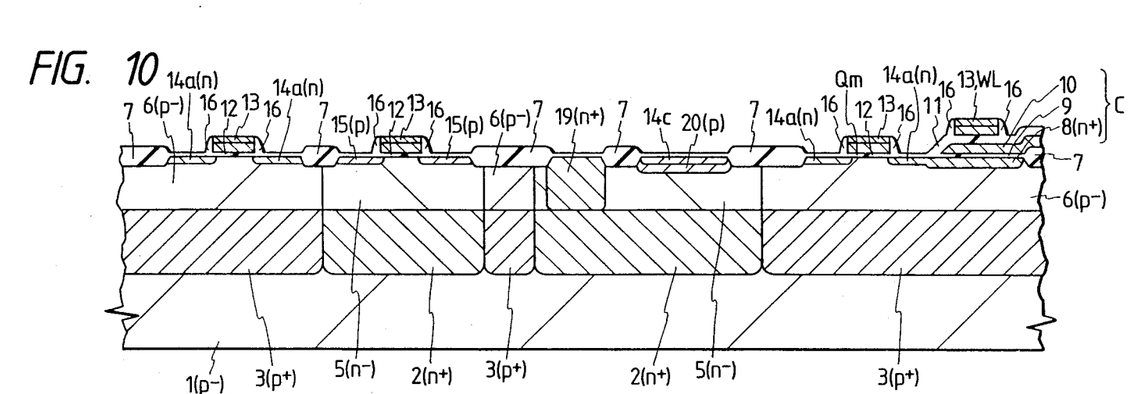

Then, in the region for forming the base region of the bipolar transistor Tr, a p type semiconductor region 20 is formed in the main surface portion of the n⁻type well region 5, as shown in FIG. 10. The p type semiconductor region 20, which is used as an intrinsic base region, can be formed, for example, at a depth of about 0.25 μm from the substrate surface by an ion implantation method with an energy of 30 to 40 KeV, using boron of about $10^{14}$ atoms/cm².

Since the n type semiconductor region 14b is formed near the surface of the p type semiconductor region 20, the n and p type impurities compensate each other, resulting in that a p⁻type semiconductor region 14c is formed.

Figure 11:
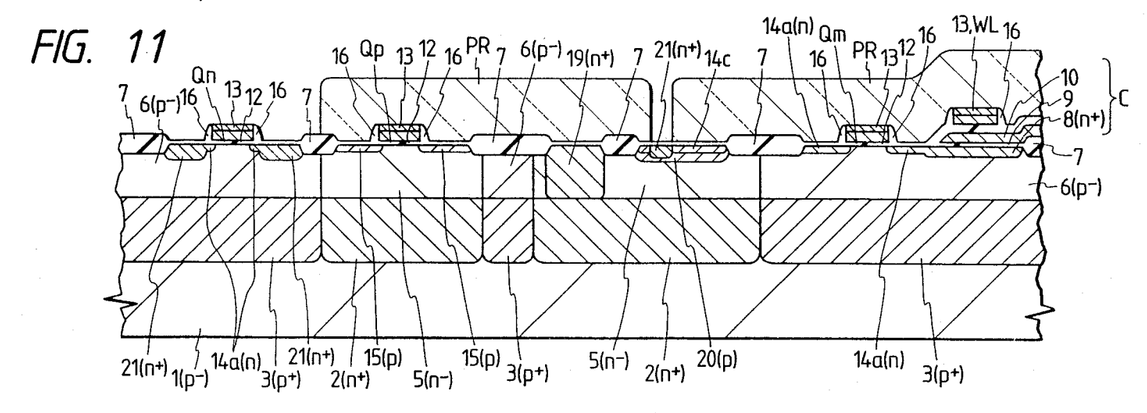

Next, as shown in FIG. 11, in the n channel MISFET Qn forming region of the complementary MISFET forming region CMOS, n⁺type semiconductor regions 21 are formed in the main surface portion of the p⁻type well region 6, while at the same time, in the region for forming an emitter region in the bipolar transistor forming region Bip, an n+type semiconductor region 21 is formed in the main surface portions of the p- and p type semiconductor regions 14c, 20. The former n+type semiconductor regions 21 are used as source and drain regions of the n channel MISFET Qn, while the latter n+type semiconductor region 21 is used as an emitter region of the bipolar transistor Tr. For example, the n+type semiconductor regions 21 can be formed by an ion implantation method with an energy of 70 to 90 KeV, using arsenic of a high purity concentration of $10^{15}$ to $10^{16}$ atoms/cm$^2$. In case of forming the emitter region 21, there is used a mask such as a photoresist film PR in impurity introduction. Since the semiconductor region 14c of a lower impurity concentration than the intrinsic base region 20 is formed sideways of the emitter region 21, it is possible to decrease the emitter-base PN junction capacitance and also possible to enhance the PN junction voltage resistance. Further, the semiconductor region 14c is formed on the whole surface of the intrinsic base region 20, so, for example, even when the position of the photoresist film PR somewhat changes due to a mask alignment error for example, it is possible to take a wide mask alignment margin in the presence of the semiconductor region 14c of a low impurity concentration at the side portion of the emitter region 21. The n+type semiconductor regions 21 are formed at a junction depth (xj) of, say 0.2 μm. By this step of forming the n+type semiconductor regions 21 there is completed the n channel MISFET Qn of the complementary MISFET.

Figure 12:
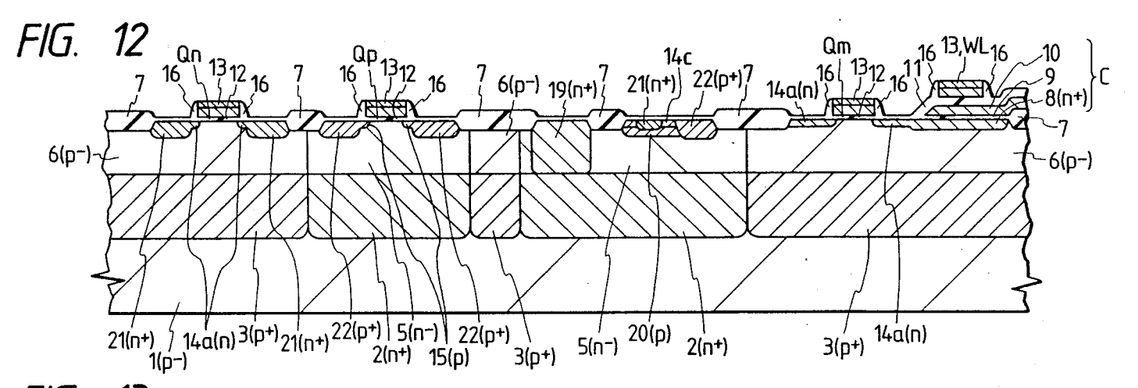

After removal of the photoresist film PR, in the region for forming the p channel MISFET Qp in the complementary MISFET forming region CMOS, as shown in FIG. 12, p+type semiconductor regions 22 are formed in the main surface portion of the n-type well region 5, while at the same time, in the region for forming a base in the bipolar transistor forming region Bip, a p+type semiconductor region 22 is formed in the main surface portion of the p type semiconductor region 20. The former p+type semiconductor regions 22 are used as source and drain regions of the p channel MISFET Qp, while the latter p$^{30}$ semiconductor region 22 is used as a graft base region of the bipolar transistor Tr. For example, the p+type semiconductor regions 22 can be formed by an ion implantation method with an energy of 70 to 90 KeV, using BF$_2$ of a high impurity concentration of $10^{15}$ atoms/cm$^2$ or so. They are formed at a junction depth of, say, 0.3 to 0.6 μm. By this step of forming the p+type semiconductor regions 22 there are completed the p channel MISFET Qp of the complementary MISFET and the bipolar transistor Tr.

Next, a layer insulation film 23 is formed on the whole surface of the substrate. For example, it is a composite film formed by laminating a BPSG film onto a silicon oxide film. The silicon oxide film is formed at a thickness of 1,500 to 2,500Å by a CVD method for example so as to prevent phosphorus and boron from leaking to the semiconductor element side from the overlying BPSG film. The BPSG film is formed at a thickness of 6,000 to 8,000Å by a CVD method for example. After deposition of the BPSG film, glass flow is applied thereto to flatten the surface of the layer insulation film 23, which glass flow is performed also for densifying at a high temperature of 900° to 1,000° C.

Figure 13:
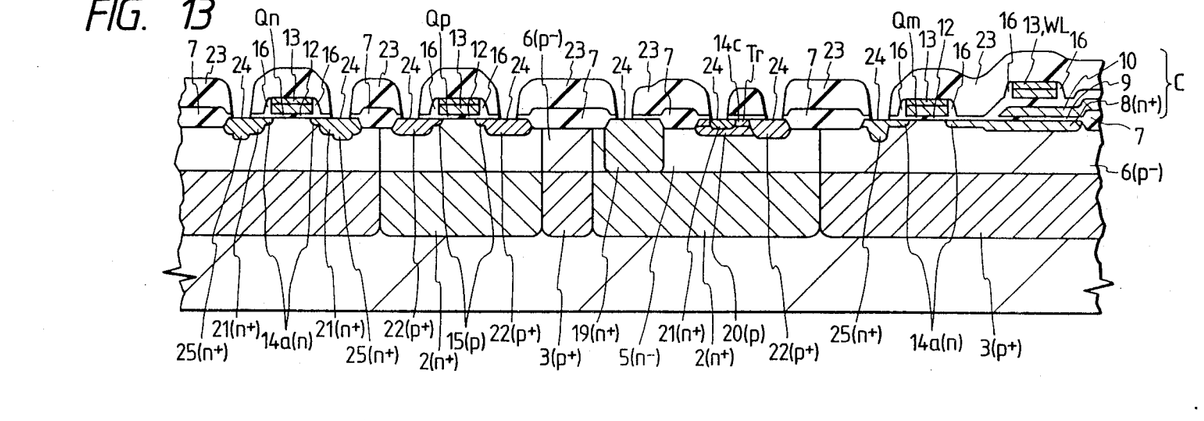

Then, in each of the n+semiconductor regions 21, potential raising n+type semiconductor region 19, n type semiconductor regions 14 and p+type semiconductor regions 22, the layer insulation film 23 and insulation film 17 are removed to form connection holes 24. And, as shown in FIG. 13, an n type impurity is introduced in the main surface portions of the n+type semiconductor regions 21, potential raising n+type semiconductor region 19 and n type semiconductor regions 14 through the connection holes 24 formed in the layer insulation film 23 and insulation film 17 to form n+type semiconductor regions 25. The n+type semiconductor regions 25 can be formed, for example, by an ion implantation method using phosphorus of a high impurity concentration of $10^{15}$ atoms/cm$^2$ or so. This n type impurity is activated by heat treatment, which heat treatment permits further glass flow of the BPSG film of the layer insulation film 23.

Figure 14:
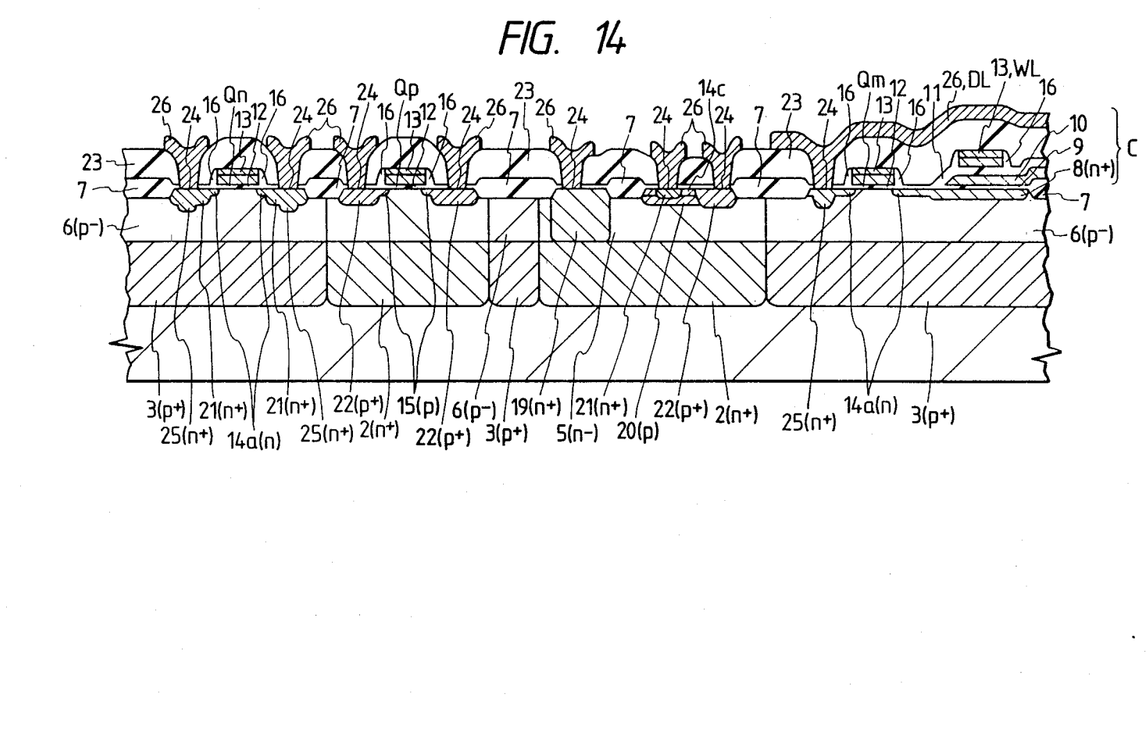

Next, as shown in FIG. 14, lines 26 (including data line 26) are formed on the layer insulation film 23 for connection to predetermined regions through the connection holes 24. For example, the lines 26 are each formed by a composite film obtained by laminating an aluminum alloy film containing copper and/or silicon onto an MoSi$_2$ film. The MoSi$_2$ film is formed at a thickness of 100 to 200Å by deposition according to a sputtering method for example. The aluminum alloy film is formed at a thickness of 4,000 to 6,000Å by deposition according to a sputtering method for example. The lines 26 are formed by the first-layer wiring step in the manufacturing process.

Then, a layer insulation film 27 is formed throughout the whole surface of the substrate including the portions over the lines 26. For example, the layer insulation film 27 is a composite film formed by successive lamination of a silicon oxide film deposited by a plasma CVD method, a silicon oxide film applied by an SOG method, and a silicon oxide film deposited by a plasma CVD method.

Next, the portions of the layer insulation film 27 over predetermined lines 26 are removed to form connection holes 28. To improve the step coverage of the overlying lines, the connection holes 28 are formed in combination of anisotropic etching and isotropic etching.

Then, lines 29 extending over the layer insulation film 27 are formed for connection with predetermined lines 26 through the connection holes 28. For example, the lines 29 are each an aluminum alloy film same as that described above, which are formed by the second wiring step in the manufacturing process.

Next, a passivation film 30 is formed throughout the whole surface of the substrate including the portions over the lines 29. For example, it is a composite film formed by laminating a silicon nitride film onto a silicon oxide film both formed by a plasma CVD method. By forming the passivation film 30 there is completed the combined type semiconductor integrated circuit device shown in FIG. 1.

Thus, by introducing in the surface of the base region an impurity of reverse conductivity to that of the base region, it is possible to prevent the increase in PN junction capacitance of the side portion of the emitter region 21 (or the surface portion of the base region 20) and improve the PN junction voltage resistance even where the emitter region 21 of the bipolar transistor Tr is formed by the same layer (same manufacturing step) as that of the source-drain region of a high concentration of the MISFET. Consequently, since the cut-off frequency $f_T$ of the bipolar transistor can b improved, it is possible to increase the speed of charging and discharging large capacitance loads such as large output loads and word lines. Moreover, since the PN junction voltage resistance is improved, it is possible to improve the electrical reliability of the bipolar transistor.

Besides, such improvement in speed and voltage resistance of the bipolar transistor Tr can be attained without requiring any additional manufacturing step.

Although the present invention has been described above concretely in terms of the above embodiment, it goes without saying that the invention is not limited thereto and that various modifications may be made within the scope not departing from the gist thereof.

For example, in the combined type semiconductor integrated circuit device described above there may be mounted a static type random access memory (SRAM) as RAM, or a non-volatile memory such as mask ROM, EPROM, or EEPROM.

Further, although in the above embodiment the semiconductor regions 14b of a low concentration are formed near the surface of the base region 20 of the bipolar transistor by the introduction of impurity which is for forming the low concentration regions 14a of the n channel type MISFET of LDD structure, the semiconductor regions 14b may be formed by newly introducing an n type impurity of a low concentration in said base region after forming the side wall spacers 16 of the MISFET Qn and Qp. In this case as a mask in the introduction of the said n type impurity there may be used a photoresist film PR of the pattern shown in FIG. 6.

What is claimed is:

1. A method for manufacturing a semiconductor device including at least one MOSFET and at least one bipolar transistor, comprising the steps of:
   (a) providing a semiconductor body having a main surface, said body including a first semiconductor region of a first conductivity type in which a MOSFET is to be formed, and a second semiconductor region of a second conductivity type opposite to said first conductivity type, in which a bipolar transistor is to be formed, in said main surface;
   (b) forming a gate electrode of said MOSFET on said first semiconductor region through a gate insulating film;
   (c) introducing a first impurity of said second conductivity type into a surface of said first semiconductor region at both sides of said gate electrode, and also introducing simultaneously said first impurity into a surface of said second semiconductor region, whereby there are formed a pair of third semiconductor regions serving as part of source and drain regions of said MOSFET in said first semiconductor region and a fourth semiconductor region in said second semiconductor region;
   (d) introducing a second impurity of a higher concentration that than of said fourth semiconductor region, of said first conductivity type, into said second semiconductor region, whereby there is formed a fifth semiconductor region of said first conductivity type serving as a base region of said fourth semiconductor region, so as to overlap with said fourth semiconductor region; and
   (e) introducing a third impurity of said second conductivity type having a concentration higher than that of said first impurity into said fifth semiconductor region, whereby there is formed a sixth semiconductor region serving as an emitter region of said bipolar transistor.

2. A method according to claim 1, wherein by the introduction of said second impurity, said fourth semiconductor region changes into a semiconductor region of said first conductivity type and becomes a seventh semiconductor region.

3. A method according to claim 2, wherein an impurity concentration of said seventh semiconductor region, of said first conductivity type, is lower than that of said fifth semiconductor region.

4. A method according to claim 3, wherein said seventh and fifth semiconductor regions integrally form said base region of said bipolar transistor.

5. A method according to claim 4, wherein the depth of said sixth semiconductor region is larger than that of said seventh semiconductor region.

6. A method according to claim 1, wherein said first conductivity type is P type, while said second conductivity type is N type.

7. A method according to claim 1, wherein said semiconductor body is an ipitaxial layer formed on a main surface of a first conductivity type semiconductor substrate.

8. A method according to claim 7, wherein said first semiconductor region is a well region and is electrically connected with said first conductivity type semiconductor substrate.

9. A method according to claim 7, wherein said second semiconductor region serves as a collector region of said bipolar transistor.

10. A method according to claim 9, wherein a diffusion layer for drawing-out a collector of said bipolar transistor is formed in said second semiconductor region.

11. A method according to claim 1, further comprising a step of introducing a fourth impurity of said second conductivity type, having a concentration higher than that of said first impurity, into said first semiconductor region at both sides of said gate electrode, whereby there is formed a pair of eighth semiconductor regions serving as a part of said source and drain regions of said MOSFET.

12. A method according to claim 11, wherein said pair of third semiconductor regions and said pair of eighth semiconductor regions integrally form the source and drain regions of said MOSFET.

13. A method according to claim 12, wherein said MOSFET is of an LDD structure.

14. A method according to claim 11, wherein said fourth and third impurities of said second conductivity type are simultaneously introduced.

15. A method according to claim 1, wherein said semiconductor body has a ninth semiconductor region of said second conductivity type in said main surface, and wherein a first conductivity type MOSFET is formed in said ninth semiconductor region.

16. A method according to claim 15, wherein said semiconductor body further has a tenth semiconductor region of said first conductivity type, and wherein a second conductivity type MOSFET and capacitor electrically connected in series with a source region of said second conductivity type MOSFET are formed in said tenth semiconductor region.

17. A method according to claim 16, wherein said tenth semiconductor region is a memory cell forming region of a DRAM.

* * * * *